(12) United States Patent
Kim et al.

(10) Patent No.: US 12,266,549 B2
(45) Date of Patent: Apr. 1, 2025

(54) FLUID SUPPLY NOZZLE FOR SEMICONDUCTOR SUBSTRATE TREATMENT AND SEMICONDUCTOR SUBSTRATE TREATMENT APPARATUS HAVING THE SAME

(71) Applicant: APET CO., LTD., Pyeongtaek-si (KR)

(72) Inventors: Tae Woo Kim, Hwaseong-si (KR); Sang Su Lee, Osan-si (KR); Jae Hoon Hwang, Yongin-si (KR)

(73) Assignee: APET CO., LTD., Pyeongtaek-si (KR)

(*) Notice: Subject to any disclaimer, the term of this patent is extended or adjusted under 35 U.S.C. 154(b) by 0 days.

(21) Appl. No.: 18/141,903

(22) Filed: May 1, 2023

(65) Prior Publication Data
US 2023/0369080 A1   Nov. 16, 2023

(30) Foreign Application Priority Data
May 12, 2022   (KR) .................. 10-2022-0058434

(51) Int. Cl.
*H01L 21/67*   (2006.01)
*H01L 21/687*   (2006.01)

(52) U.S. Cl.
CPC .... *H01L 21/6715* (2013.01); *H01L 21/68764* (2013.01)

(58) Field of Classification Search
CPC ........... H01L 21/6715; H01L 21/68764; H01L 21/67051; H01L 21/6708; H01L 21/68714; B05B 7/0408
See application file for complete search history.

(56) References Cited

U.S. PATENT DOCUMENTS 8,673,110 B2   3/2014   Park et al.
9,142,433 B2   9/2015   Miyagi et al.
(Continued)

FOREIGN PATENT DOCUMENTS

CN   215354918 U   * 12/2021
JP   H10151422 A   * 1/2003
(Continued)

OTHER PUBLICATIONS

KR 101685159 B1 Written Description (Year: 2016).*
(Continued)

*Primary Examiner* — Mikhail Kornakov
*Assistant Examiner* — Emily H Yasharpour
(74) *Attorney, Agent, or Firm* — Womble Bond Dickinson (US) LLP

(57) ABSTRACT

A fluid supply nozzle for semiconductor substrate treatment, which supplies a treatment liquid in which a plurality of solutions are mixed to a semiconductor substrate, includes a nozzle body configured to mix the plurality of solutions to form a treatment liquid when the plurality of solutions are supplied into an inner space of the nozzle body, the nozzle body having a shape with an open upper portion, a solution supply channel with a plurality of solution supply pipes for supplying the plurality of solutions to the inner space, a solution guide device configured to guide the plurality of solutions and generate a rotary current or an eddy current to mix the plurality of solutions, and a rotary cartridge configured to accelerate the mixing of the plurality of solutions to generate a homogeneous treatment liquid.

7 Claims, 19 Drawing Sheets

(56) References Cited

U.S. PATENT DOCUMENTS

| | | |
|---|---|---|
| 9,324,602 B2 | 4/2016 | Shinohara et al. |
| 9,403,187 B2 | 8/2016 | Negoro et al. |
| 9,768,010 B2 | 9/2017 | Ito et al. |
| 10,464,107 B2 | 11/2019 | Iwata et al. |
| 10,622,242 B2 | 4/2020 | Muramoto |
| 10,700,166 B2 | 6/2020 | Kai et al. |
| 10,755,952 B2 | 8/2020 | Sasagawa et al. |
| 2013/0051967 A1 | 2/2013 | Muramoto |
| 2016/0240400 A1* | 8/2016 | Takahashi ........... H01L 21/6708 |
| 2018/0090306 A1 | 3/2018 | Higashijima et al. |

FOREIGN PATENT DOCUMENTS

| | | | |
|---|---|---|---|
| JP | 2004-327674 A | 11/2004 | |
| JP | 2009-079254 A | 4/2009 | |
| JP | 2009-231466 A | 10/2009 | |
| JP | 4630881 B2 * | 2/2011 | ............... B08B 3/04 |
| JP | 5877016 B2 | 1/2016 | |
| JP | 5993625 B2 | 8/2016 | |
| JP | 6068181 B2 | 1/2017 | |
| JP | 7061439 B2 | 4/2022 | |
| KR | 10-2007-0118320 A | 12/2007 | |
| KR | 10-1042539 B1 | 6/2011 | |
| KR | 10-1068872 B1 | 9/2011 | |
| KR | 10-1109071 B1 | 1/2012 | |
| KR | 10-2012-0009712 A | 2/2012 | |
| KR | 10-1344930 B1 | 12/2013 | |
| KR | 10-1384477 B1 | 4/2014 | |
| KR | 10-1439742 B1 | 9/2014 | |
| KR | 10-1450965 B1 | 10/2014 | |
| KR | 10-2016-0136124 | 11/2016 | |
| KR | 101685159 B1 * | 12/2016 | |
| KR | 10-2017-0014776 A | 2/2017 | |
| KR | 10-1751568 B1 | 6/2017 | |
| KR | 10-1770880 B1 | 8/2017 | |
| KR | 10-2017-0110440 A | 10/2017 | |
| KR | 10-1833684 B1 | 2/2018 | |
| KR | 10-1891128 | 8/2018 | |
| KR | 10-1914681 B1 | 11/2018 | |
| KR | 10-1910803 B1 | 1/2019 | |
| KR | 10-1944147 B1 | 1/2019 | |
| KR | 10-1964204 B1 | 4/2019 | |
| KR | 10-1966805 B1 | 8/2019 | |
| KR | 10-2073822 B1 | 2/2020 | |
| KR | 10-2223259 B1 | 3/2021 | |
| KR | 10-2418934 B1 | 7/2022 | |
| KR | 10-2432448 B1 | 8/2022 | |
| TW | 201939602 A | 10/2019 | |
| TW | I710408 B | 11/2020 | |

OTHER PUBLICATIONS

JP-4630881-B2 Written Description (Year: 2011).*
JP H10151422 A Written Description (Year: 2003).*
CN215354918U Written Description (Year: 2021).*
Korean Notice of Allowance dated Aug. 24, 2023 issued in corresponding Korean Patent Application No. (12 pages, including 6 pages English translation).
Office Action dated Oct. 26, 2023 issued for the counterpart Taiwan Patent Application No. 112116992, including English translation, 8pp.

* cited by examiner

FLUID SUPPLY NOZZLE FOR SEMICONDUCTOR SUBSTRATE TREATMENT AND SEMICONDUCTOR SUBSTRATE TREATMENT APPARATUS HAVING THE SAME

CROSS-REFERENCE TO RELATED APPLICATION

This application claims priority to and the benefit of Korean Patent Application No. 10-2022-0058434, filed on May 12, 2022, the disclosure of which is incorporated herein by reference in its entirety.

BACKGROUND

1. Field of the Invention

The present disclosure relates to a fluid supply nozzle for semiconductor substrate treatment, and a semiconductor substrate treatment apparatus including the same.

2. Discussion of Related Art

A semiconductor manufacturing process may include various processes of performing depositing, photographing, etching, and cleaning on a semiconductor substrate. A substrate treatment process is a process of supplying various types of treatment liquids to a substrate and may include spraying two or more types of treatment liquids on a rotating semiconductor substrate at a predetermined flow rate in a predetermined order.

A treatment liquid, which is to be supplied to the semiconductor substrate, may be supplied to a nozzle through a pump and sprayed from the nozzle to the semiconductor substrate. In particular, a plurality of solutions may be mixed and supplied as the treatment liquid according to a substrate treatment process.

Meanwhile, the treatment liquid in a state in which a plurality of solutions are homogeneously mixed is required. When the plurality of solutions in the treatment liquid are not homogeneously mixed, unevenness may occur in regions of the semiconductor substrate. In addition, it may be difficult to maintain the quality of semiconductors that are produced sequentially.

SUMMARY OF THE INVENTION

To address the problems of the related art described above, the present disclosure is directed to providing a fluid supply nozzle for semiconductor substrate treatment, which is capable of supplying a treatment liquid in which a plurality of solutions are homogeneously mixed to a semiconductor substrate, and a semiconductor substrate treatment apparatus including the same.

According to an aspect of the present disclosure, a fluid supply nozzle, for semiconductor substrate treatment, which supplies a treatment liquid that is a mixture of a plurality of solutions to a semiconductor substrate, includes: a nozzle body that is configured to mix the plurality of solutions to form a treatment liquid when the plurality of solutions are supplied into an inner space and has a shape with an open upper portion, a solution supply channel with a plurality of solution supply pipes for supplying the plurality of solutions to the inner space, a solution guide device configured to guide the plurality of solutions and generate a rotary current or an eddy current to mix the plurality of solutions, and a rotary cartridge configured to accelerate the mixing of the plurality of solutions to generate a homogeneous treatment liquid, in which the rotary cartridge includes a rotary shaft having an upper portion rotatably fixed to the solution guide device and at least one first blade and at least one second blade which are spaced apart from each other in a longitudinal direction of the rotary shaft, and is replaceably provided in the nozzle body.

Specifically, the solution guide device may include a cover part configured to open or close the open upper portion of the nozzle body, a plurality of supply pipe guide parts each corresponding to one of the plurality of solution supply pipes, a plurality of screw threads configured to form flow paths, through which the plurality of solutions flow, together with wall surfaces of the inner space, and a plurality of solution outlets configured to discharge the plurality of solutions supplied from the plurality of supply pipe guide parts to the flow paths formed by the plurality of screw threads and the wall surfaces of the inner space.

Specifically, the plurality of screw threads may be tilted in a height direction of the nozzle body to generate a rotary current or an eddy current of the plurality of solutions discharged from the flow paths.

Specifically, an upper surface of the first blade may be tilted in a height direction of the nozzle body, and an upper surface of the second blade may be perpendicular to or tilted in the height direction of the nozzle body.

Specifically, the fluid supply nozzle may further include a pipe conduit fixing device configured to fix the plurality of solution supply pipes to the plurality of supply pipe guide parts.

Specifically, the nozzle body may include a discharge port for discharging the treatment liquid, and the discharge port may be provided at a bottom of the nozzle body.

Specifically, the treatment liquid may be a treatment liquid for a hot sulfuric peroxide mixture (SPM), and include sulfuric acid and hydrogen peroxide.

According to other spect of the present disclosure, a semiconductor substrate treatment apparatus includes a rotary table providing a space in which a semiconductor substrate is mounted, a housing providing a space in which the rotary table is installed, and the above-described fluid supply nozzle for semiconductor substrate treatment, in which the fluid supply nozzle for semiconductor substrate treatment supplies a treatment liquid to the semiconductor substrate, and is provided in a part of the housing.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
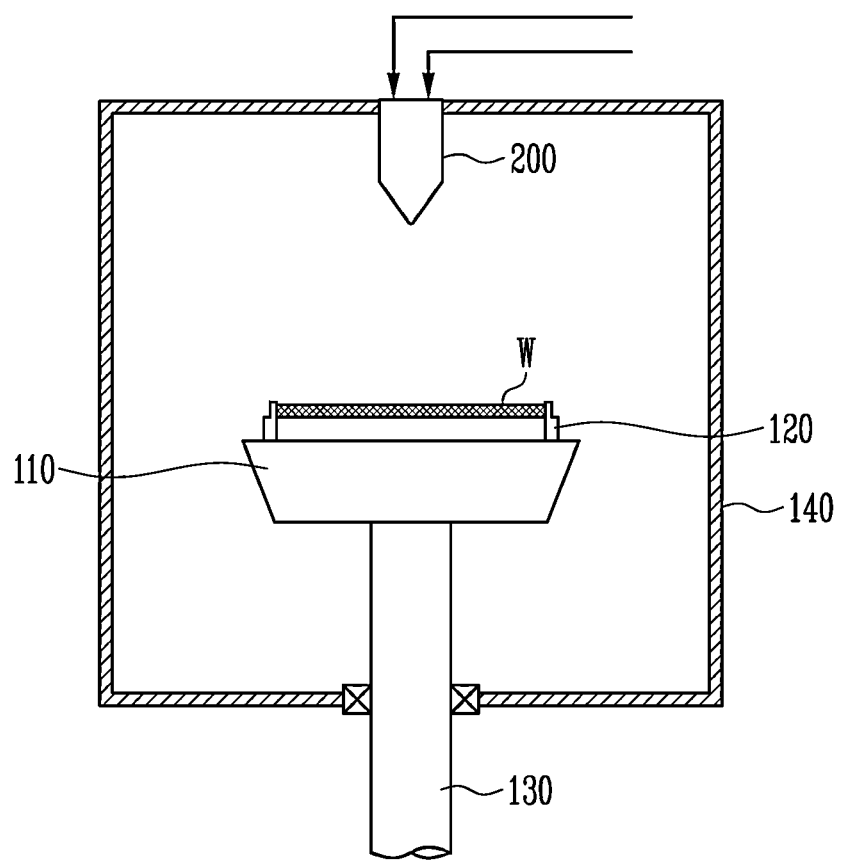
FIG. 1 is a conceptual diagram for describing a semiconductor substrate treatment apparatus according to the present disclosure.

The object, particular advantages, and novel features of the present disclosure will become more apparent from the following detailed description and example embodiments in conjunction with the appended drawings. It should be noted that when reference numerals are assigned to components in the drawings, the same reference numerals are assigned to the same components even in different drawings if possible. The related art related to the present disclosure is not described in detail herein when it is determined that the description thereof would obscure the subject matter of the present disclosure.

Hereinafter, a semiconductor substrate should be understood as being provided to form a semiconductor functional layer by growing a semiconductor material on a surface thereof, and as including means for fixing the semiconductor substrate.

Hereinafter, semiconductor substrate treatment should be understood to include a process of forming a functional layer, including a desired material, on a substrate using a treatment liquid or removing impurities or contaminants other than the desired material.

Hereinafter, embodiments of the present disclosure will be described in detail with reference to the accompanying drawings.

Figure 2:
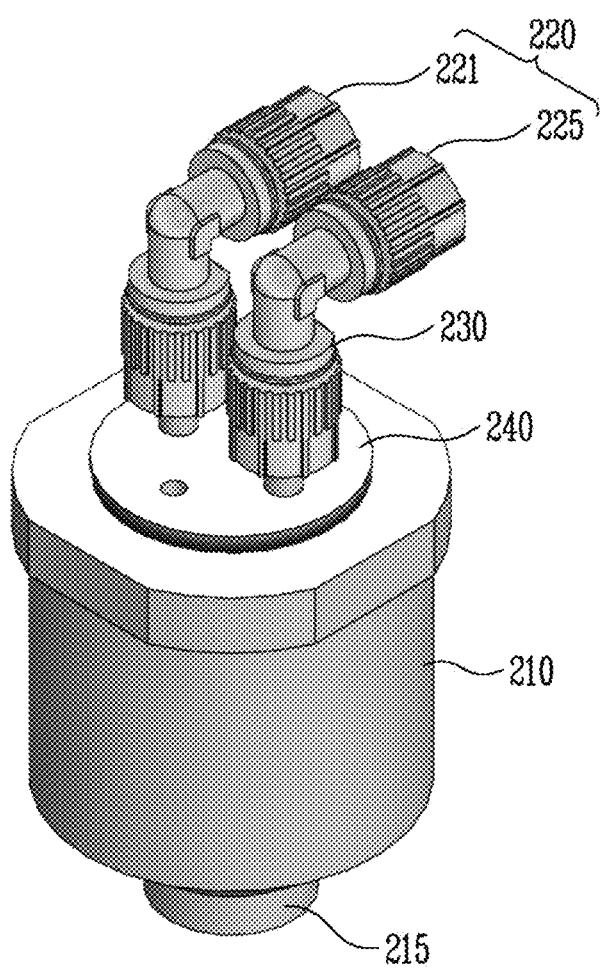
FIG. 2 is a perspective view of a fluid supply nozzle for semiconductor substrate treatment according to a first embodiment of the present disclosure.
Figure 3:
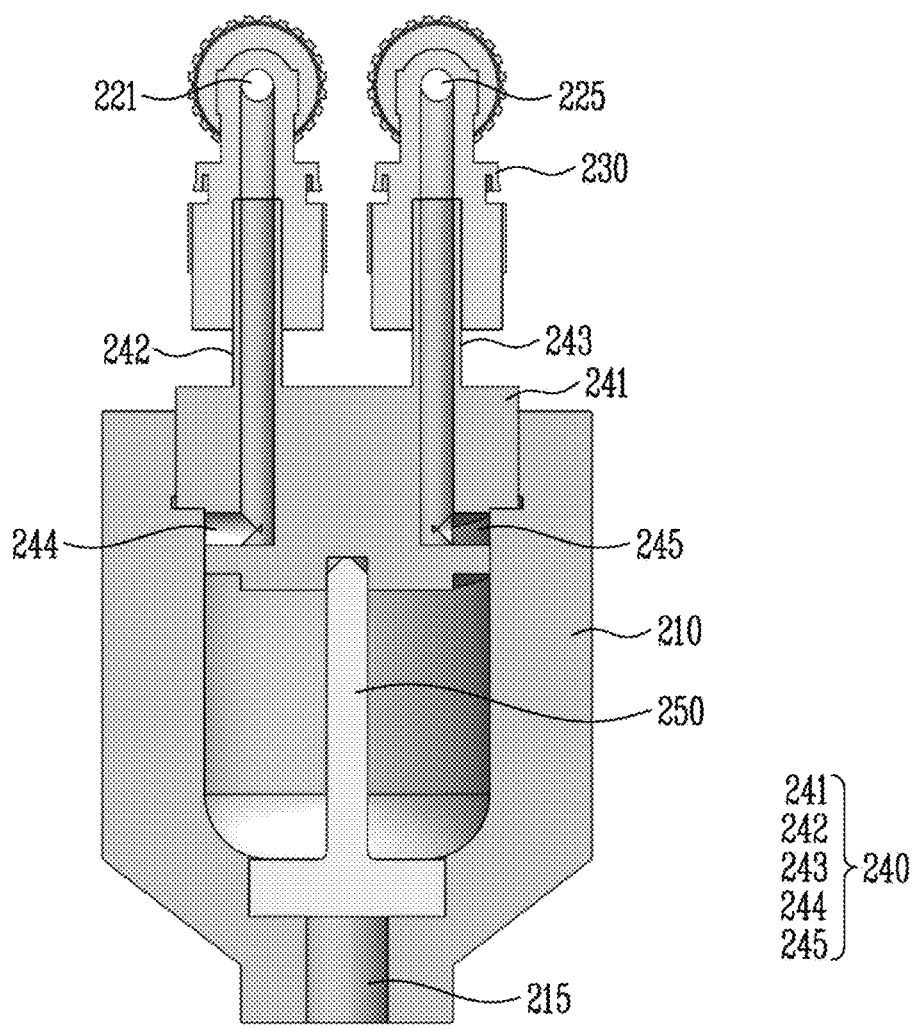
FIG. 3 is a cross-sectional view of the fluid supply nozzle for semiconductor substrate treatment according to the first embodiment of the present disclosure.
Figure 4:
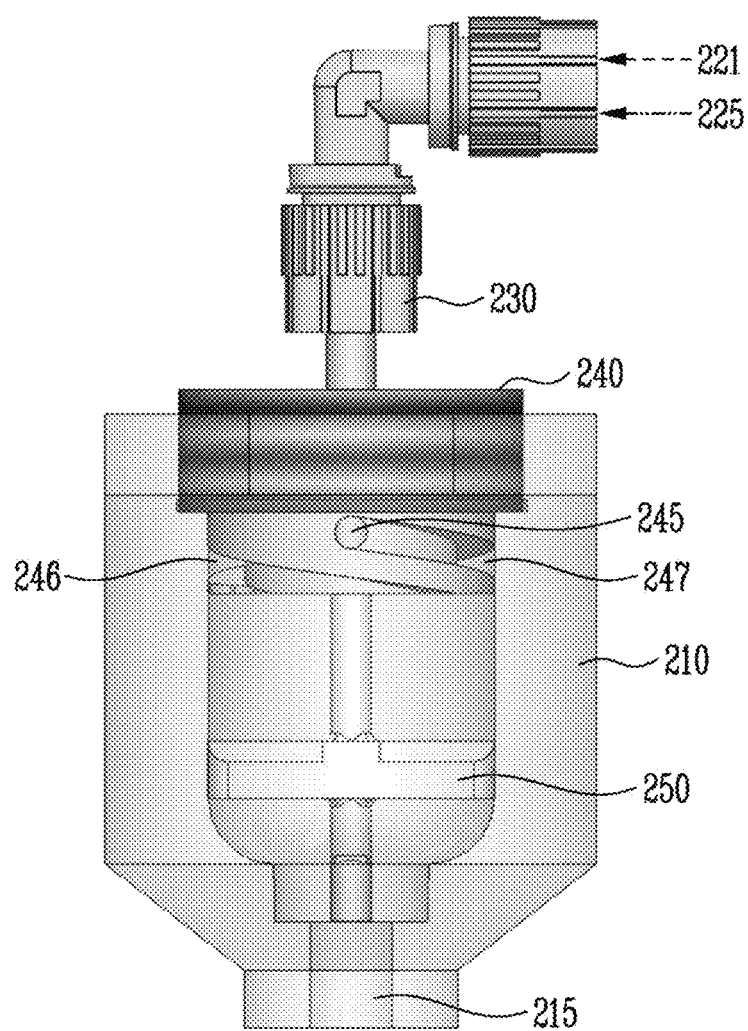
FIG. 4 is a transparent perspective view of the fluid supply nozzle for semiconductor substrate treatment according to the first embodiment of the present disclosure.
Figure 5:
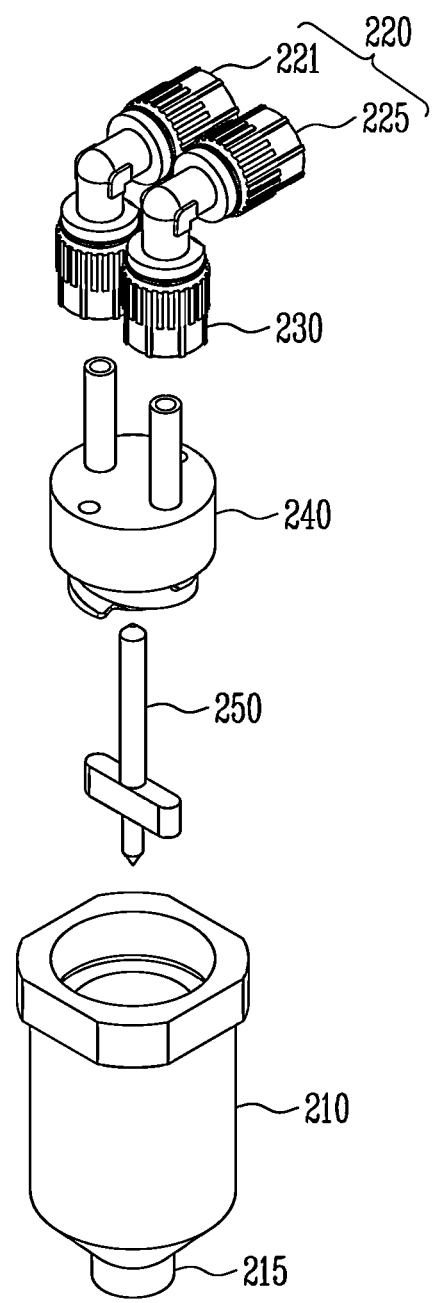
FIG. 5 is an exploded perspective view of the fluid supply nozzle for semiconductor substrate treatment according to the first embodiment of the present disclosure.
Figure 6:
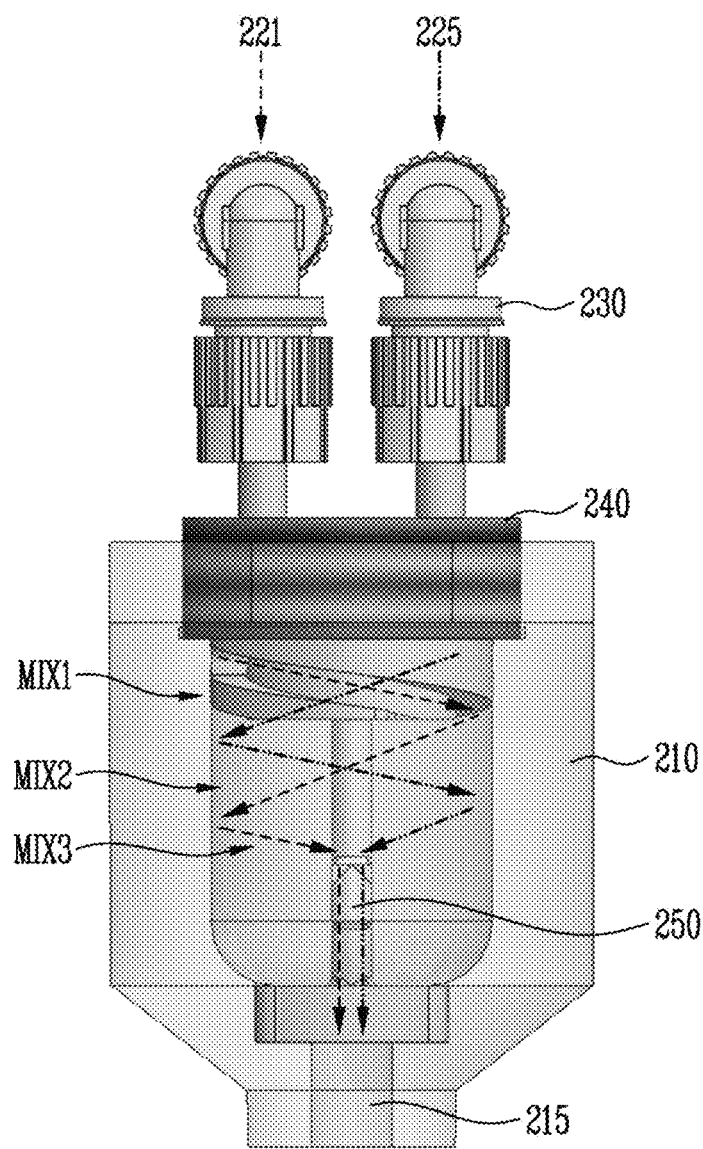
FIGS. 6 and 7 are transparent perspective views of the fluid supply nozzle for semiconductor substrate treatment according to the first embodiment of the present disclosure.
Figure 7:
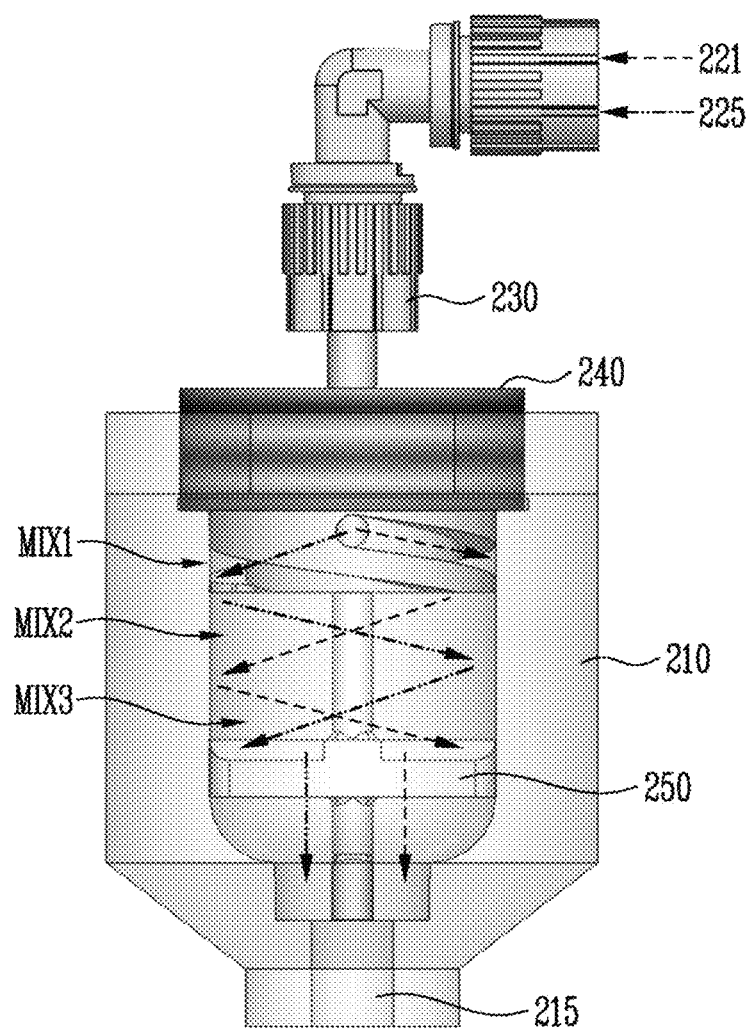

FIG. 1 is a conceptual diagram for describing a semiconductor substrate treatment apparatus according to the present disclosure. FIG. 2 is a perspective view of a fluid supply nozzle for semiconductor substrate treatment according to a first embodiment of the present disclosure. FIG. 3 is a cross-sectional view of the fluid supply nozzle for semiconductor substrate treatment according to the first embodiment of the present disclosure. FIG. 4 is a transparent perspective view of the fluid supply nozzle for semiconductor substrate treatment according to the first embodiment of the present disclosure. FIG. 5 is an exploded perspective view of the fluid supply nozzle for semiconductor substrate treatment according to the first embodiment of the present disclosure. FIGS. 6 and 7 are transparent perspective views of the fluid supply nozzle for semiconductor substrate treatment according to the first embodiment of the present disclosure. FIGS. 8 to 11 are perspective views of examples of fluid mixing cartridge of the fluid supply nozzle for semiconductor substrate treatment according to the first embodiment of the present disclosure.

Referring to FIGS. 1 to 11, a semiconductor substrate treatment apparatus 10 according to the first embodiment of the present disclosure may be an apparatus for treating a surface of a substrate S by spraying a treatment liquid containing a plurality of solutions to the surface of the substrate S.

The semiconductor substrate treatment apparatus 10 may include a housing 140, a rotary table 110, and a fluid supply nozzle 200 for semiconductor substrate treatment.

The housing 140 may provide a space for arranging therein the rotary table 110 and the fluid supply nozzle 200 for semiconductor substrate treatment. In the housing 140, the rotary table 110 may be provided to be exposed to the outside but embodiments are not limited thereto.

The rotary table 110 may be provided in the housing 140 and provide a space in which semiconductor substrate S is installed. The rotary table 110 may include a plurality of chuck pins 120 radially arranged around a table rotation shaft 130. The plurality of chuck pins 120 may have a shape that protrudes and extends from one surface of the rotary table 110, and the semiconductor substrate S may be mounted between the plurality of chuck pins 120. The semiconductor substrate S may be detachably attached to be spaced a predetermined distance from one surface of the rotary table 110 by the plurality of chuck pins 120. The semiconductor substrate S may be rotated together with the rotation of the rotary table 110 while being fixed by the plurality of chuck pins 120.

The rotary table 110 may have a disk shape but is not limited thereto and may have one of other various shapes.

The rotary table 110 may be coupled to a rotation driving unit (not shown) through the table rotation shaft 130 at the center thereof. The rotation driving unit includes a motor and the like, and may transmit a turning force to the rotary table 110 through the table rotation shaft 130. That is, the rotation driving unit may rotate the rotary table 110. The table rotation shaft 130 may be parallel to a height direction of the semiconductor substrate treatment apparatus 10.

The fluid supply nozzle 200 for semiconductor substrate treatment may be provided in a portion of the housing 140. For example, the fluid supply nozzle 200 for semiconductor substrate treatment may be provided in an upper portion of the housing 140.

The fluid supply nozzle 200 for semiconductor substrate treatment may supply a treatment liquid to the semiconductor substrate S on the rotary table 110. Here, the treatment liquid may be a mixture of a first solution and a second solution. In the present embodiment, the treatment liquid is described as the mixture of the first solution and the second solution but is not limited thereto. For example, the treatment liquid may further include an additional solution, as well as the first solution and the second solution.

The fluid supply nozzle 200 for semiconductor substrate treatment may include a nozzle body 210, a solution supply channel 220, a solution guide device 240, a pipe conduit fixing device 230, and a rotary cartridge 250.

The nozzle body 210 may form the exterior of the fluid supply nozzle 200 for semiconductor substrate treatment. The nozzle body 210 may have a structure in which an upper portion is open, and provide an inner space in which the rotary cartridge 250 may be provided to mix a plurality of solutions supplied from the solution supply channel 220. The inner space of the nozzle body 210 may be in the form of a rotating body.

In the inner space of the nozzle body 210, the plurality of solutions supplied from the solution supply channel 220 are homogeneously mixed to generate the treatment liquid.

A discharge port 215 may be provided at the bottom of the nozzle body 210 to discharge a treatment liquid that is a mixture of a plurality of solutions.

The solution supply channel 220 may include a plurality of solution supply pipes 221 and 225. For example, the solution supply channel 220 may include a first solution supply pipe 221 and a second solution supply pipe 225, and the first solution and the second solution may be supplied to the inner space of the nozzle body 210 through the first solution supply pipe 221 and the second solution supply pipe 225.

The solution guide device 240 may cover the open upper portion of the nozzle body 210. In addition, the solution guide device 240 may guide the first solution and the second solution, which are supplied from the first solution supply pipe 221 and the second solution supply pipe 225, through the pipe conduit fixing device 230 to mix the first solution and the second solution.

The solution guide device 240 may include a cover part 241 for opening or closing the open upper portion of the nozzle body 210, a first supply pipe guide part 242 and a second supply pipe guide part 243 into which the first solution supply pipe 221 and the second solution supply pipe 225 are respectively inserted, a first solution outlet 244 and a second solution outlet 245 for respectively discharging the first solution supplied to the first supply pipe guide part 242 and the second solution supplied to the second supply pipe guide part 243, and a first screw thread 246 and a second screw thread 247 respectively coupled to the first solution outlet 244 and the second solution outlet 245.

Here, a gasket (not shown) may be provided outside of the cover part 241, and may maintain airtightness between the nozzle body 210 and the solution guide device 240 to prevent leakage of the first solution and the second solution.

The first supply pipe guide part 242 and the second supply pipe guide part 243 may be provided on the cover part 241 and spaced apart from each other. The first supply pipe guide part 242 may include an inner space into which the first solution supply pipe 221 may be inserted, and the second supply pipe guide part 243 may include an inner space into which the second solution supply pipe 225 may be inserted.

The first solution outlet 244 and the second solution outlet 245 may be provided to be spaced apart from each other, and allow the first solution and the second solution to be discharged with a slope in a height direction of the fluid supply nozzle 200 for semiconductor substrate treatment.

The first screw thread 246 and the second screw thread 247 may form flow paths, through which the first solution and the second solution may flow, together with wall surfaces of the inner space of the nozzle body 210. Here, the first solution and the second solution discharged from the first solution outlet 244 and the second solution outlet 245 may flow through the flow paths formed by the first screw thread 246, the second screw thread 247, and the wall surfaces of the inner space of the nozzle body 210.

Because the first screw thread 246 and the second screw thread 247 are formed to be tilted in the height direction of the fluid supply nozzle 200 for semiconductor substrate treatment, a rotary current or an eddy current may be formed in the first solution and the second solution that flow through the flow paths formed by the first screw thread 246, the second screw thread 247, and the wall surfaces of the inner space of the nozzle body 210. The first solution and the second solution may be homogeneously mixed due to the rotary current or the eddy current.

The pipe conduit fixing device 230 may fix the first solution supply pipe 221 and the second solution supply pipe 225 on the solution guide device 240. In particular, the pipe conduit fixing device 230 is provided to each of the first solution supply pipe 221 and the second solution supply pipe 225 to respectively fix the first solution supply pipe 221 and the second solution supply pipe 225 to the first supply pipe guide part 242 and the second supply pipe guide part 243 of the solution guide device 240.

The rotary cartridge 250 accelerates the mixing of the first solution and the second solution discharged from the first solution outlet 244 and the second solution outlet 245 to generate a treatment liquid in which the first solution and the second solution are homogeneously mixed.

The rotary cartridge 250 may include a rotary shaft 251 whose upper portion is rotatably fixed on the cover part 241 of the solution guide device 240, and at least one first blade 253 and at least one second blade 255 that are provided to be spaced apart from each other in a longitudinal direction of the rotary shaft 251 to accelerate the mixing of the first solution and the second solution.

Here, a lower portion of the rotary shaft 251 may be rotatably fixed on a lower portion of the nozzle body 210. One of the first blade 253 and the second blade 255, e.g., the first blade 253, may be disposed on a portion of the rotary shaft 251 in the longitudinal direction, and a plurality of first blades 253 may be provided.

The other of the first and second blades 253 and 255, e.g., the second blade 255, may be disposed at the bottom of the rotary shaft 251, and a plurality of second blades 255 may be provided.

Figure 8:
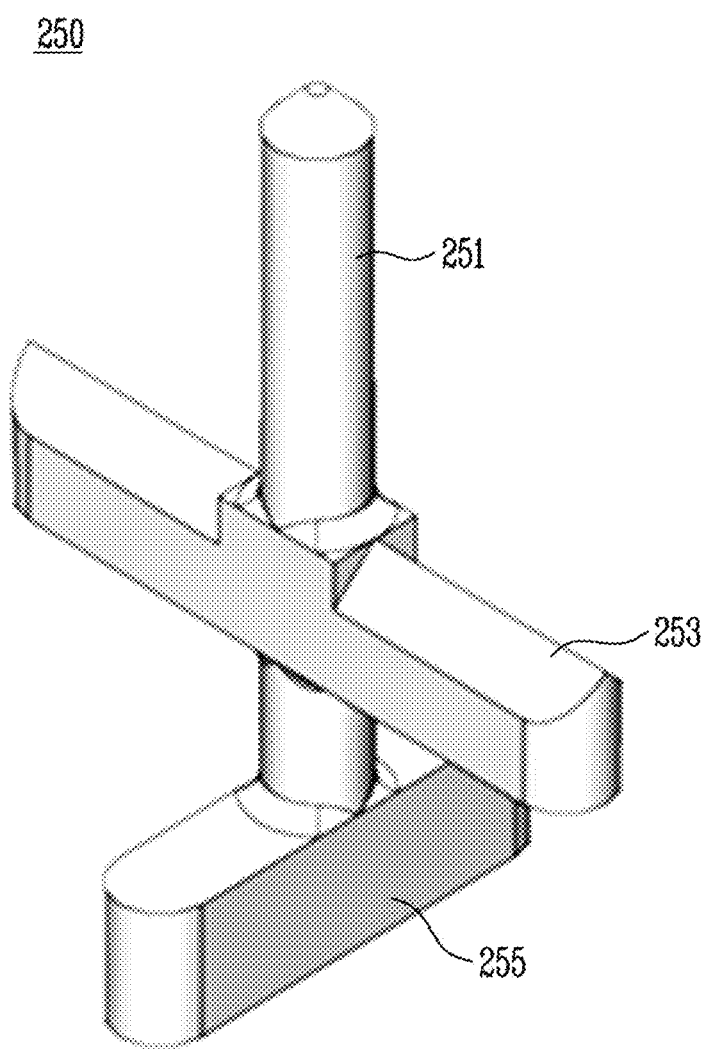
FIGS. 8 to 11 are perspective views of examples of a fluid mixing cartridge of the fluid supply nozzle for semiconductor substrate treatment according to the first embodiment of the present disclosure.
Figure 9:
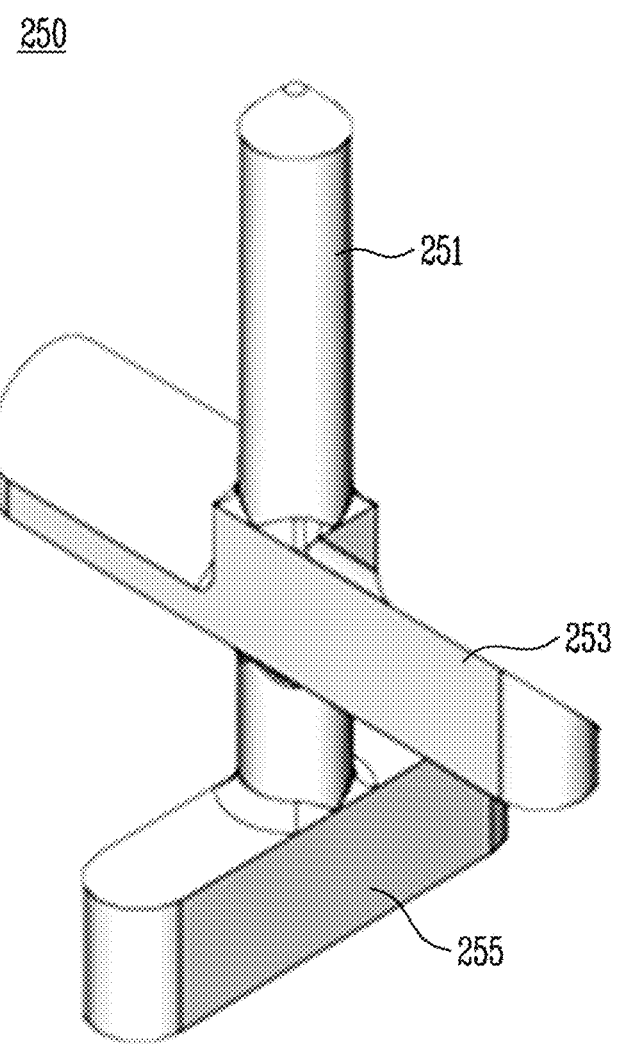
Figure 10:
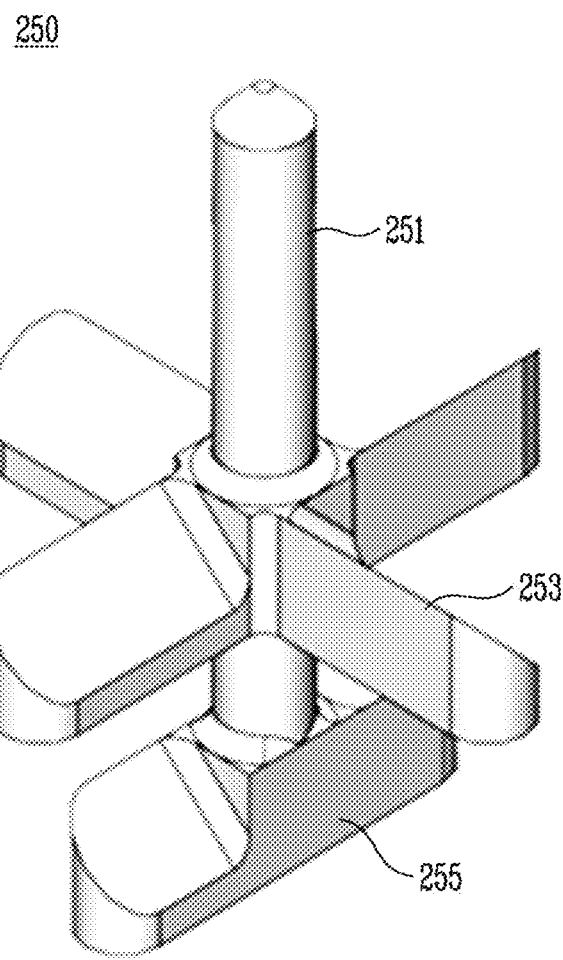
Figure 11:
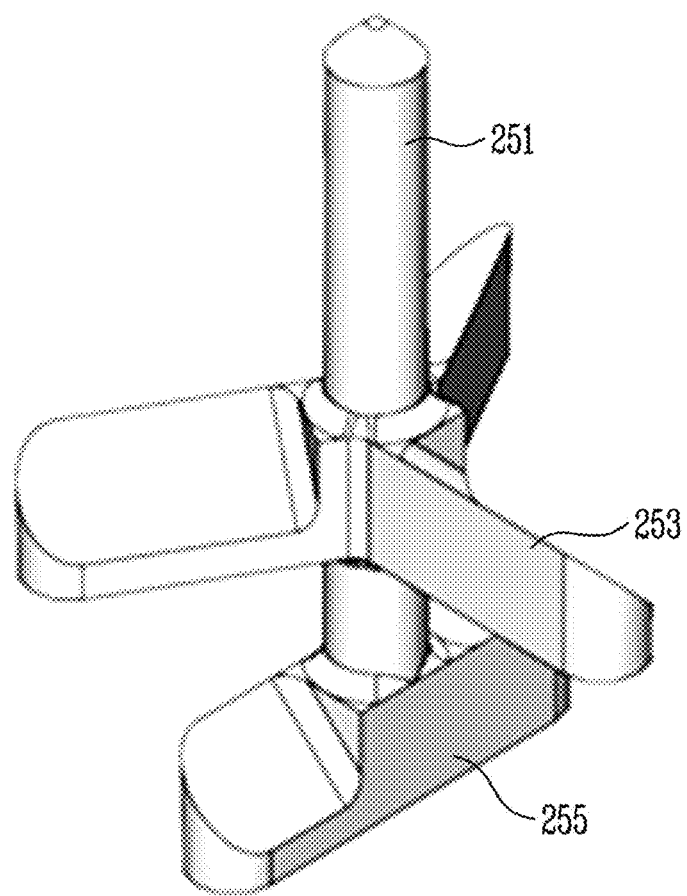

Meanwhile, a plurality of first blades 253 may be provided. For example, as shown in FIGS. 8 and 9, two first blades 253 may be provided. As shown in FIG. 10, four first blades 253 may be provided. As shown in FIG. 11, three first blades 253 may be provided.

An upper surface of the first blade 253 may be tilted in the height direction of the fluid supply nozzle 200 for semiconductor substrate treatment.

An upper surface of the second blade 255 may be perpendicular to or tilted in the height direction of the fluid supply nozzle 200 for semiconductor substrate treatment. For example, as shown in FIGS. 8 and 9, the upper surface of the second blade 255 may be perpendicular to the height direction of the fluid supply nozzle 200 for semiconductor substrate treatment. As shown in FIGS. 10 and 11, the upper surface of the second blade 255 may be tilted in the height direction of the fluid supply nozzle 200 for semiconductor substrate treatment.

The rotary cartridge 250 as described above may rotate according to the flow of the first solution and the second solution even when power is not provided, and the mixing of the first solution and the second solution may be accelerated due to the rotation of the first blade 253 and the second blade 255, so that a treatment liquid in which the first solution and the second solution are homogeneously mixed may be generated.

Meanwhile, the fluid supply nozzle 200 for semiconductor substrate treatment may select and use one of rotary cartridges 250 illustrated in FIGS. 8 to 11 according to physical properties of the first solution and the second solution and a level of homogeneity of the solutions in the treatment liquid. That is, the rotary cartridge 250 is replaceable, and thus, the solution guide device 240 covering the upper portion of the nozzle body 210 may be removed and one of the rotary cartridges 250 shown in FIGS. 8 to 11 may be selected and installed.

A method of supplying the treatment liquid to the semiconductor substrate S using the fluid supply nozzle 200 for semiconductor substrate treatment according to the present embodiment will be described below.

First, the treatment liquid supplied to the semiconductor substrate S may include a first solution and a second solution.

The first solution and the second solution may be introduced into the solution guide device 240 through the first solution supply pipe 221 and the second solution supply pipe 225 of the solution supply channel 220.

In the solution guide device 240, the first solution and the second solution may be induced to the first solution outlet 244 and the second solution outlet 245 through the first supply pipe guide part 242 and the second supply pipe guide part 243. A rotary current or an eddy current may be formed in the first solution and the second solution discharged from the first solution outlet 244 and the second solution outlet 245 due to the first screw thread 246 and the second screw thread 247. The first solution and the second solution may be mixed in the inner space of the nozzle body 210 due to the rotary current or the eddy current. For example, due to the rotary current or the eddy current, the first solution and the second solution may be moved downward and mixed while being rotated multiple times along the wall surfaces of the inner space of the nozzle body 210. Particularly, the number of rotations of the first solution and the second solution in the inner space of the nozzle body 210 may be determined by the length of the inner space of the nozzle body 210 in the height direction.

When the first solution and the second solution move downward while being mixed due to the rotary current or the eddy current, the first blade 253 and the second blade 255 of the rotary cartridge 250 may be rotated. Accordingly, when the first blade 253 and the second blade 255 are rotated, the mixing of the first solution and the second solution may be accelerated, thus generating the treatment liquid in which the first solution and the second solution are homogeneously mixed.

The treatment liquid in which the first solution and the second solution are homogeneously mixed may be discharged to the outside through the discharge port 215 at the bottom of the nozzle body 210. For example, the treatment liquid in which the first solution and the second solution are homogeneously mixed may be sprayed onto a surface of the substrate S from the fluid supply nozzle 200, for semiconductor substrate treatment, through the discharge port 215.

Meanwhile, various types of solutions may be contained in a treatment liquid of an embodiment of the present disclosure according to the use of a semiconductor substrate treatment apparatus. For example, the treatment liquid may include at least two materials among sulfuric acid ($H_2SO_4$), hydrogen peroxide ($H_2O_2$), ammonia ($NH_3$), deionized (DI) water, and dilute hydrofluoric acid (DHF).

Specifically, when the treatment liquid is a treatment liquid for a hot sulfuric peroxide mixture (SPM) having a maximum temperature of around 240 degrees, the treatment liquid may include sulfuric acid ($H_2SO_4$) and hydrogen peroxide ($H_2O_2$).

As described above, in the fluid supply nozzle 200 for semiconductor substrate treatment according to the present disclosure, solutions may be mixed in the nozzle body 210 due to a rotary current or an eddy current, and the mixing of the solutions may be accelerated by the rotary cartridge 250. Therefore, the fluid supply nozzle 200 for semiconductor substrate treatment may generate a treatment liquid in which a plurality of solutions are homogeneously mixed and supply the treatment liquid to the substrate S.

Figure 12:
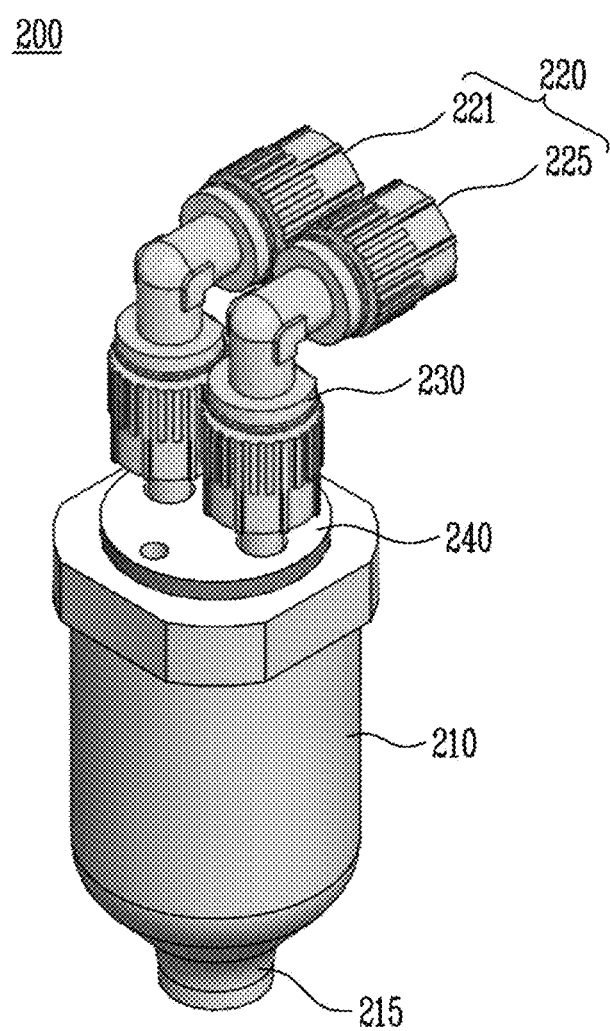
FIG. 12 is a perspective view of a fluid supply nozzle for semiconductor substrate treatment according to a second embodiment of the present disclosure.
Figure 13:
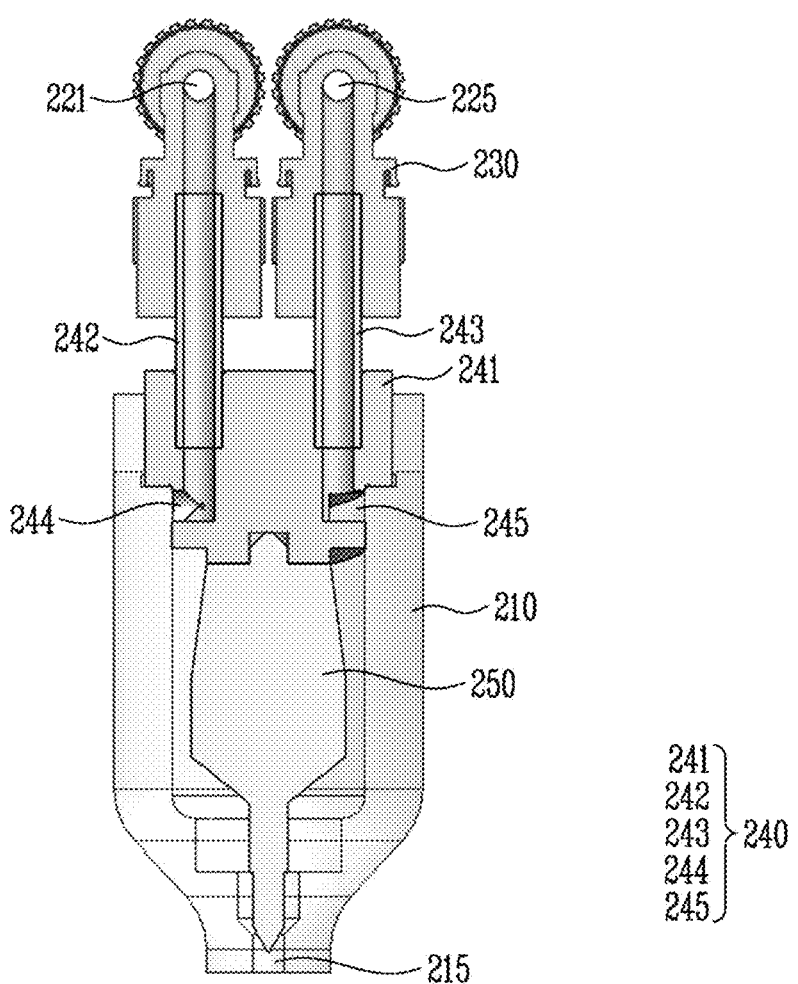
FIG. 13 is a cross-sectional view of the fluid supply nozzle for semiconductor substrate treatment according to the second embodiment of the present disclosure.
Figure 14:
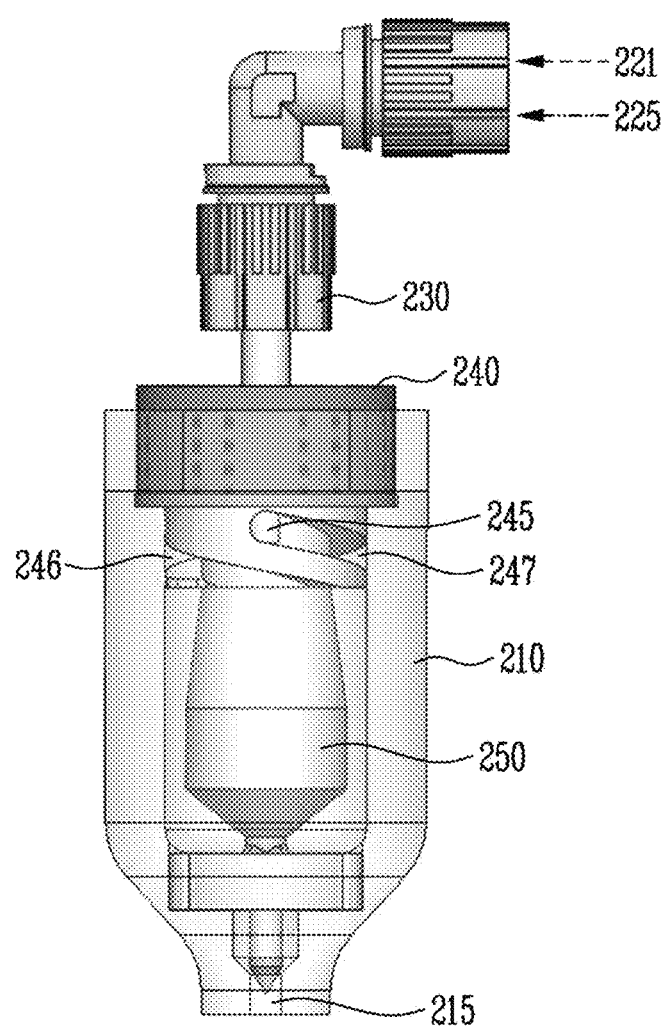
FIGS. 14 to 17 are transparent perspective views of the fluid supply nozzle for semiconductor substrate treatment according to the second embodiment of the present disclosure.
Figure 15:
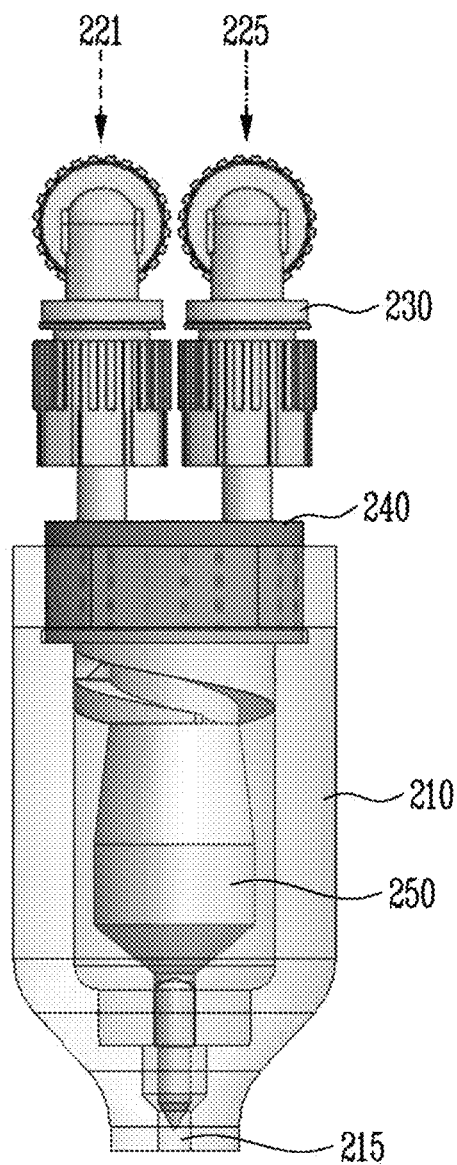
Figure 16:
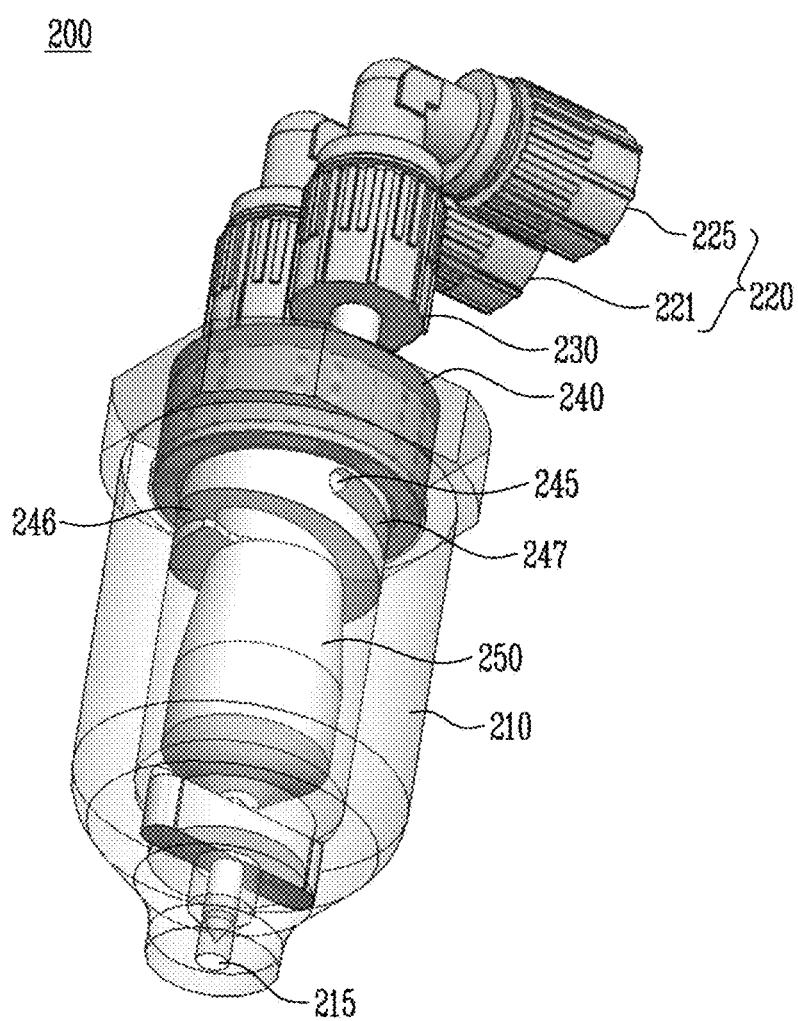
Figure 17:
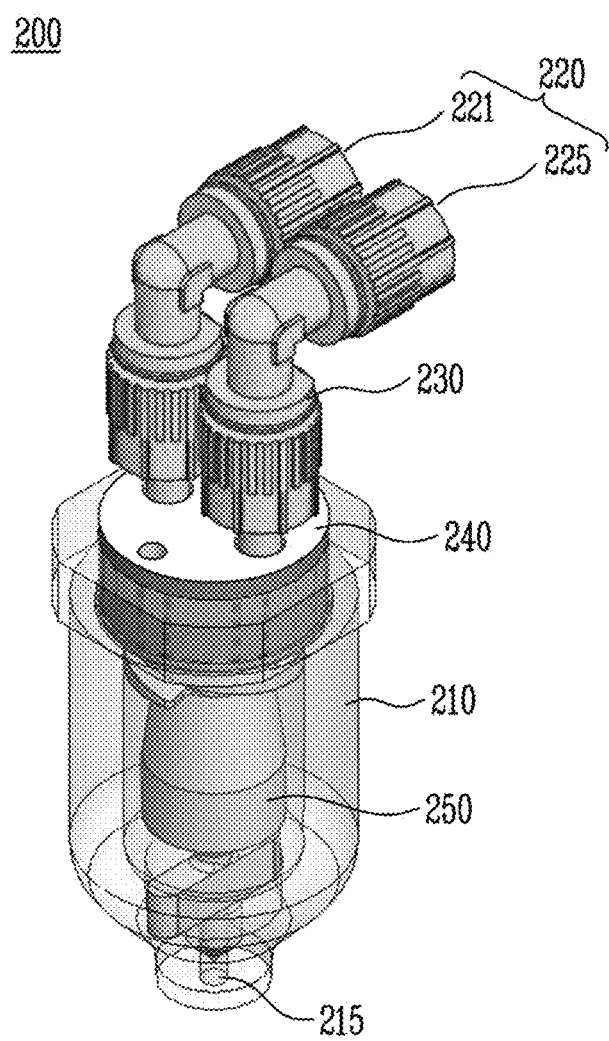
Figure 18:
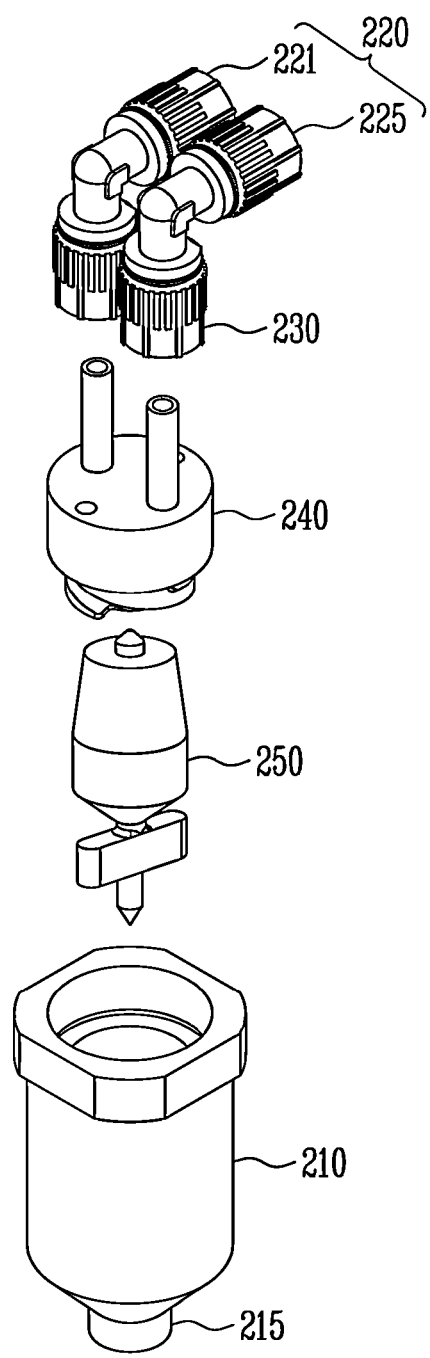
FIG. 18 is an exploded perspective view of the fluid supply nozzle for semiconductor substrate treatment according to the second embodiment of the present disclosure.
Figure 19:
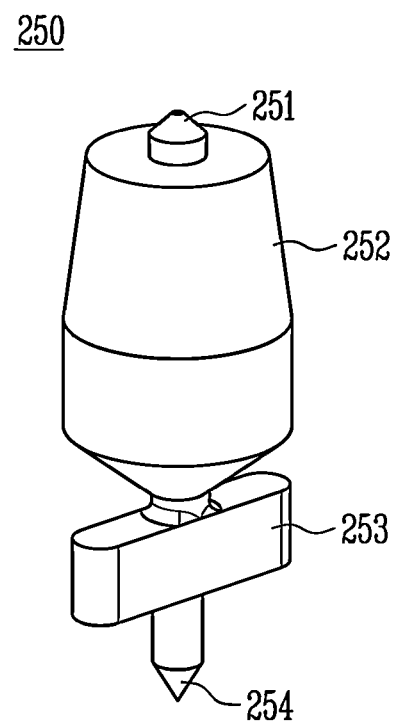
FIG. 19 is a perspective view of a fluid mixing cartridge of the fluid supply nozzle for semiconductor substrate treatment according to the second embodiment of the present disclosure.

FIG. 12 is a perspective view of a fluid supply nozzle for semiconductor substrate treatment according to a second embodiment of the present disclosure. FIG. 13 is a cross-sectional view of the fluid supply nozzle for semiconductor substrate treatment according to the second embodiment of the present disclosure. FIGS. 14 to 17 are transparent perspective views of the fluid supply nozzle for semiconductor substrate treatment according to the second embodiment of the present disclosure. FIG. 18 is an exploded perspective view of the fluid supply nozzle for semiconductor substrate treatment according to the second embodiment of the present disclosure. FIG. 19 is a perspective view of a fluid mixing cartridge of the fluid supply nozzle for semiconductor substrate treatment according to the second embodiment of the present disclosure.

Hereinafter, these embodiments will be described focusing on differences from the previous embodiment, and a description of parts thereof that are the same as those of the previous embodiment is omitted here.

In the present embodiment, a shape of the periphery of a discharge port 215 provided in a nozzle body 210 may be different from that in the previous embodiment. Specifically, the nozzle body 210 of the present embodiment may have a curved shape that tapers from top to bottom.

In addition, in the present embodiment, a shape of a rotary cartridge 250 may be variable. As in the previous embodiment, the rotary cartridge 250 of the present embodiment includes a rotary shaft 251 rotatably fixed on a cover part 241, and at least one first blade 253 provided to be spaced apart from each other in a longitudinal direction of the rotary shaft 251 to accelerate the mixing of a first solution and a second solution.

On the other hand, the rotary cartridge 250 of the present embodiment may further include a body part 252 and a protruding part 254. The body part 252 may be inserted into an inner space of the nozzle body 210 to adjust the flow of the first and second solutions in the inner space, and may expand more than a first rotary shaft 251.

For example, a cross-section of the body part 252 expanding at the bottom of the first rotary shaft 251 gradually increases and decreases from top to bottom. In this case, a degree of increase in the cross-section of the body part 252 in a downward direction may vary according to a height, and for example, a degree of increase in a cross-section of an upper portion of the body part 252 may be higher than a degree of increase in a cross-section of a middle portion of the body part 252. On the other hand, a cross-section of a lower portion of the body part 252 decreases and thus the body part 252 has a shape similar to a jar.

The protruding part 254 may be provided at the bottom of the body part 252 having the above-described shape. The protruding part 254 may be inserted into an upper side of the discharge port 215 of the nozzle body 210, and support the rotation of the body part 252 at the bottom of the body part 252. That is, the protruding part 254 may be referred to as a second rotary shaft, and performs a function similar to that of the first rotary shaft 251.

Although the protruding part 254 is not described in the previous embodiment, the protruding part 254 may be applicable to the previous embodiment when the shape of the rotary cartridge 250 of FIG. 5 is taken into consideration.

The fluid supply nozzle for semiconductor substrate treatment and the semiconductor substrate treatment apparatus including the same according to the present disclosure are capable of supplying a treatment liquid, in which a plurality of solutions are homogeneously mixed, to a semiconductor substrate.

The present disclosure is not limited to the above-described embodiments, and may include, as a new embodiment, a combination of at least two of the above-described embodiments or a combination of at least one of the above-described embodiments and the well-known techniques.

While the present disclosure has been described above in detail with reference to specific embodiments, the present disclosure is not limited thereto and it will be obvious that modifications and changes may be made by those of ordinary skill in the art within the technical scope of the present disclosure.

It should be understood that simple modifications or changes made in the present disclosure are within the scope of the present disclosure and the specific protection scope of the present disclosure will become apparent from the appended claims.

What is claimed is:

1. A fluid supply spray nozzle for semiconductor substrate treatment, which supplies a treatment liquid in which a plurality of solutions are mixed to a semiconductor substrate, the fluid supply nozzle comprising:
    a nozzle body configured to mix the plurality of solutions to form a treatment liquid when the plurality of solutions are supplied into an inner space, the nozzle body having a shape with an open upper portion;
    a solution supply channel with a plurality of solution supply pipes for supplying the plurality of solutions to the inner space;
    a solution guide device comprising a plurality of screw threads configured to form flow paths through which the plurality of solutions flow together with wall surfaces of the inner space, and configured to guide the plurality of solutions and generate a rotary current or an eddy current to mix the plurality of solutions; and
    a rotary cartridge configured to accelerate the mixing of the plurality of solutions to generate a homogeneous treatment liquid after the plurality of solutions are flowed through the flow paths formed by the screw threads, wherein the solution guide device comprises: a cover part configured to open or close the open upper portion of the nozzle body,
    wherein the rotary cartridge comprises:
    a rotary shaft having an upper portion rotatably fixed to the cover part of the solution guide device; and
    at least one first blade and at least one second blade which are spaced apart from each other in a longitudinal direction of the rotary shaft, and
    the rotary cartridge is replaceably provided in the nozzle body,
    wherein the nozzle body comprises a discharge port for discharging the treatment liquid directly to the semiconductor substrate, and
    wherein the discharge port is provided at a bottom of the nozzle body.

2. The fluid supply spray nozzle of claim 1, wherein the solution guide device comprises:
    a plurality of supply pipe guide parts each corresponding to one of the plurality of solution supply pipes; and
    a plurality of solution outlets configured to discharge the plurality of solutions supplied from the plurality of supply pipe guide parts to the flow paths formed by the plurality of screw threads and the wall surfaces of the inner space.

3. The fluid supply spray nozzle of claim 2, wherein the plurality of screw threads are tilted in a height direction of the nozzle body to generate a rotary current or an eddy current of the plurality of solutions discharged from the flow paths.

4. The fluid supply spray nozzle of claim 2, wherein an upper surface of the first blade is tilted in a height direction of the nozzle body, and
    an upper surface of the second blade is perpendicular to or tilted in the height direction of the nozzle body.

5. The fluid supply spray nozzle of claim 2, further comprising a pipe conduit fixing device configured to fix the plurality of solution supply pipes to the plurality of supply pipe guide parts.

6. The fluid supply spray nozzle of claim 1, wherein the treatment liquid is a treatment liquid for a hot sulfuric peroxide mixture (SPM) and comprises sulfuric acid and hydrogen peroxide.

7. A semiconductor substrate treatment apparatus comprising:
    a rotary table providing a space in which a semiconductor substrate is mounted;
    a housing providing a space in which the rotary table is installed; and
    the fluid supply spray nozzle for semiconductor substrate treatment of claim 1,
    wherein the fluid supply spray nozzle for semiconductor substrate treatment supplies a treatment liquid to the semiconductor substrate, and is provided in a part of the housing.

* * * * *